United States Patent [19]
Neidorff et al.

[11] Patent Number: 4,593,206
[45] Date of Patent: Jun. 3, 1986

[54] FIXED SLEW RATE BUS DRIVER CIRCUIT

[75] Inventors: Robert A. Neidorff, Chandler; W. Eric Main, Mesa, both of Ariz.

[73] Assignee: Motorola, Inc., Schaumburg, Ill.

[21] Appl. No.: 571,042

[22] Filed: Jan. 16, 1984

[51] Int. Cl.⁴ .......................... H03K 3/26; H03K 5/22
[52] U.S. Cl. .............................. 307/270; 307/296 R; 307/299 B; 307/494
[58] Field of Search ............... 307/270, 299 B, 296 R, 307/494, 473

[56] References Cited

U.S. PATENT DOCUMENTS

| | | | |
|---|---|---|---|
| 3,348,065 | 10/1967 | Schmidt | 307/294 |
| 4,122,402 | 10/1978 | Main | 307/299 B |
| 4,258,330 | 3/1981 | Kaneka et al. | 307/299 B |

*Primary Examiner*—Stanley D. Miller
*Assistant Examiner*—B. P. Davis

*Attorney, Agent, or Firm*—Michael D. Bingham

[57] ABSTRACT

A circuit for driving a serial data bus with serial logic data that is supplied to the circuit while buffering the logic data supplying circuit from the data bus. The circuit provides logic output pulses having controlled slew rates wherein the input logic data is not distorted but which inhibits undesired high frequency components associated with the fast rise and fall times of the leading and trailing edges of the input logic data pulses. The circuit comprises an inverting amplifier having capacitive feedback between the output and the inverting input of the amplifier, a buffer amplifier between the output of the inverting amplifier and the output of the circuit, and current switching circuitry for sinking and sourcing currents of equal magnitude at the input of the inverting amplifier depending on the relative magnitude of the input logic data pulses.

11 Claims, 2 Drawing Figures

FIXED SLEW RATE BUS DRIVER CIRCUIT

BACKGROUND OF THE INVENTION

This invention relates to driver circuits responsive to applied input signals for sourcing current at a high impedance output. More particularly, the present invention relates to a monolithic driver circuit responsive to an applied input logic pulse signal for supplying an output logic signal having controlled and fixed slew rates, i.e., rise and fall times associated therewith; the driver circuit buffering the logic input signal drive circuitry from load circuitry coupled to the output of the driver circuit and capable of providing logic level shifting.

There are a myriad of applications wherein it is desirable to buffer input signal drive ciruitry from a load circuit while accurately reproducing the input signal drive across the load circuit. For example, one such application may require reproducing logic drive signals onto a serial data bus without distorting the data contained in the logic drive signal while eliminating high frequency noise components associated with the rise and fall times of the leading and trailing edges of the logic drive input signal.

For instance, most, if not all, automobile manufacturers use multi-wiring harnesses throughout the vehicle to control multi-functions including dashboard electronics, window control, and headlight control as well as other control functions. To simplify the wiring harness and to reduce manufacturing cost, at least one automobile manufacturer has proposed the use of only two wires serially driven by logic drive signals to control the aforementioned multi-functions. For instance, a microprocessor could be utilized to serially interface the serial data bus represented by the two-wire harness. In this system the microprocessor may be a CMOS drive circuit for driving CMOS logic control signals onto the serial data bus. The data information from the CMOS driver circuit in this application is contained in the pulsewidth of the CMOS logic signals, i.e., a logic one would have a pulsewidth more than twice the width of a pulse representing a logic zero.

It is recognized that the fast rise and fall times associated with the CMOS logic signals contain high frequency signal components that are undesirable in the automotive environment as these components can create amplitude modulated (AM) noise. Thus, it is necessary that the high frequency components of the logic signals be eliminated without distorting the data represented by the width of the data pulse, i.e., neither lengthening nor shortening the pulsewidth of these data pulses.

Hence, a driver-buffer circuit is required that is coupled between the logic drive circuitry and the serial data bus to buffer the logic input of the CMOS circuit from the serial data bus. Such a circuit must provide symmetrical rise and fall times to maintain the integrity of the applied logic signals while reducing the slew rates of the corresponding logic signals applied to the data bus.

SUMMARY OF THE INVENTION

Accordingly, it is an object of the present invention to provide an improved driver circuit.

Another object of the present invention is to provide a monolithic driver circuit which buffers the logic input signal drive supplied thereto from a serial data bus.

Still another object of the present invention is to provide a circuit for producing output pulses having controlled slew rates associated therewith in response to receiving logic pulses that are applied thereto.

A further object of the invention is to provide a circuit for producing pulses having symmetrical rise and fall times of fixed rates in response to receiving logic pulse signals applied thereto.

In accordance with the above and other objects there is provided a monolithic driver circuit for driving a load while buffering logic control signals that are applied thereto from the load comprising an inverting amplifier having an input and an output with the inverting amplifier providing output signals inverted in phase with respect to the phase of input signals applied to the input thereof, a current switch receiving the applied logic control signals for sourcing or sinking currents having substantially equal magnitudes at the input of the inverting amplifier depending on the phase of the applied logic control signals, a feedback circuit coupled between the output and input of the inverting amplifier wherein the inverting amplifier in conjunction therewith functions as an integrator to produce output signals that have controlled slew rates associated therewith, and buffer circuitry for buffering the output of the inverting amplifier from the load.

DETAILED DESCRIPTION OF THE PREFERRED EMBODIMENTS

Figure 1:
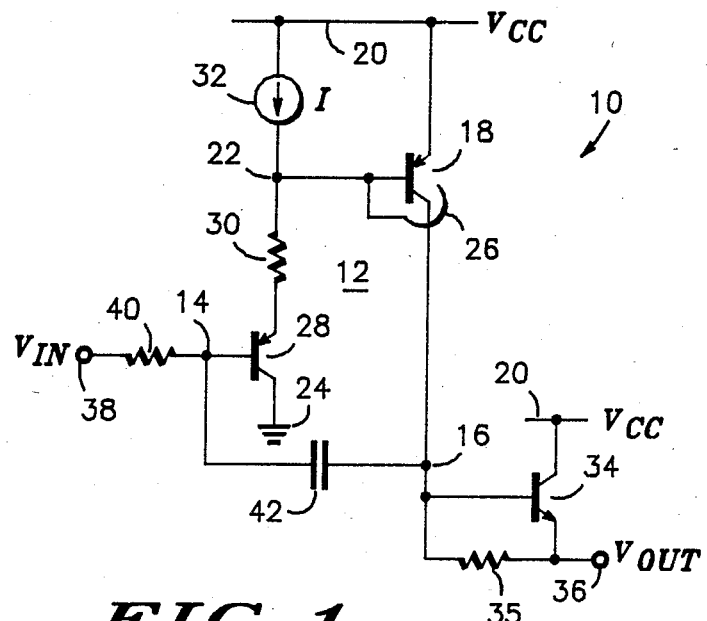
FIG. 1 is a schematic diagram illustrating a first embodiment of the present invention.

With reference to FIG. 1, buffer/driver circuit 10 of the present invention is first described. Driver circuit 10 is suited to be manufactured in monolithic circuit form utilizing known circuit fabrication techniques. Driver circuit 10 comprise an inverting amplifier (12) having an inverting input, node 14, and an output, node 16. Inverting amplifier 12 includes PNP transistor 18 configured as a common emitter amplifier with its emitter connected to power supply conductor 20, its collector connected to output 16 and its base coupled to circuit node 22. A source of operating potential, $V_{CC}$, is applied across power supply conductors 20 and 24. PNP transistor 18 is illustrated as including a P-ring or auxiliary collector 26. P-ring 26 surrounds the main collector of transistor 18 and is connected to its base as is understood. P-ring 26 is generally known in the art and functions to collect excess saturation current produced by transistor 18 as this transistor is driven into saturation as is understood. Amplifier 12 further includes PNP transistor 28 configured as a common collector amplifier with its emitter coupled via resistor 30 to node 22 to which is sourced a current of magnitude I supplied by current source 32. Inverting amplifier 12 inverts the phase of the input pulse signal applied to input 14 to produce an inverted output pulse signal at output 16 to drive the base of buffer circuit transistor 34 which is a NPN transistor configured as a voltage follower. Resistor 35 provides standard biasing of transistor 34. The output of transistor 34 drives output terminal 36 of driver circuit 10. Thus, a positive going input pulse signal applied at input 14, for example, tends to cause both transistors 28 and 18 to be rendered nonconducting which, in turn, tends to cause the output signal occurring at output 16 to decrease.

In operation a logic control input pulse signal, which for discussion purposes may be a CMOS logic pulse signal, is applied at input 38 of driver circuit 10 and is converted to a current pulse signal by resistor 40. This current pulse signal, in accordance with the polarity of the logic pulse signal applied at input 38, is either sourced to or sourced from input 14 of inverting amplifier 12 as will be more fully described hereinafter. In typical circuit operation, $V_{in}$ is a logic voltage pulse the magnitude of which is maintained either at a value of $V_{CC}$ or ($V_{CC}-5$ volts) for CMOS logic operation. Current source 32 a current that is proportional to temperature in a known manner in order to establish a bias voltage across resistor 30. This bias voltage sums with the base-emitter voltages of both transistor 18 and 28 to produce a bias voltage at input 14 having a value midpoint between the voltage swing of input signal $V_{in}$, i.e., $$V_{CC} - \frac{5 \text{ volts}}{2}.$$

Hence, a current flows through resistor 40 which, as aforementioned, is either sourced to input 14 or is sinked therefrom equal to $$\frac{5 \text{ volts}}{2R_{40}}.$$

Without feedback circuit means, capacitor 42, inverting amplifier 12 nearly reproduces, albeit inverted, the logic pulse input signal applied to input 38 at output 16. However, capacitor 42 in conjunction with inverting amplifier 12 functions as an integrator which slows both the rise and fall times of the leading and trailing edges of the logic input pulse signal symmetrically. By setting the bias voltage at input 14 to the midpoint of $V_{in}$, the switched current generate a controlled slew rate through amplifier 12. Thus, the output signal supplied through the buffer amplifier comprising transistor 34 and bias resistor 35 is a reproduction of the applied logic input pulse signal which has trailing and leading edges that are controlled to thereby inhibit high frequency components that are contained in the logic input pulse signal.

In some applications the width of the pulses supplied to input 38 determine the logic state that is applied to driver circuit 10. For example, a logic signal having a pulsewidth of approximately 70% of the logic period may be equal to a logic one whereas a pulsewidth of 30% may signify a logic zero. Thus, in order not to distort the data contained in the logic input pulse signals that are applied to driver circuit 10 the integrity of the width of the logic signal pulse must be maintained in the output signal pulse derived at output 36. There are several sources of potential errors which are eliminated or severely limited by driver circuit 10. First, as previously mentioned, the slew rates of the output pulse signals are made symmetrical to prevent distortion of the pulsewidth itself. Another source of distortion arises if transistor 18 is driven into hard saturation as the output voltage produced at output 16 rises to a value near $V_{CC}$. If transistor 18 goes into hard saturation, a longer time is required to turn off the transistor than is otherwise the case and therefore an output pulse will be produced at output 16 which is skewed with respect to the input pulse signal. To prevent the foregoing from happening, P-ring 26 is provided that surrounds the main collector of transistor 18 to collect excess saturation current and to source this current to the base of transistor 18. The net effect of the foregoing is to limit the amount that transistor 18 is driven into saturation to, therefore, inhibit distortion of logic data pulses while allowing the rise and fall times thereof to be at fixed slew rates.

Another source of error that can arise in circuit 10 is related to temperature variation. If the bias voltage developed at the base of transistor 28 is not held constant, within a predetermined temperature range, the magnitudes of the respective currents sourced or sunk at node 14 will vary with respect to each other. This would cause the rise and fall times of the output signal produced at output 16 to be non-symmetrical which is undesirable. To prevent this error, current source 32 produces a current that is proportional to temperature wherein the bias voltage developed across resistor 30 varies with temperature inversely with respect to the base-to-emitter voltages of transistors 18 and 28 to thereby maintain the bias voltage developed at input 14 substantially constant.

Figure 2:
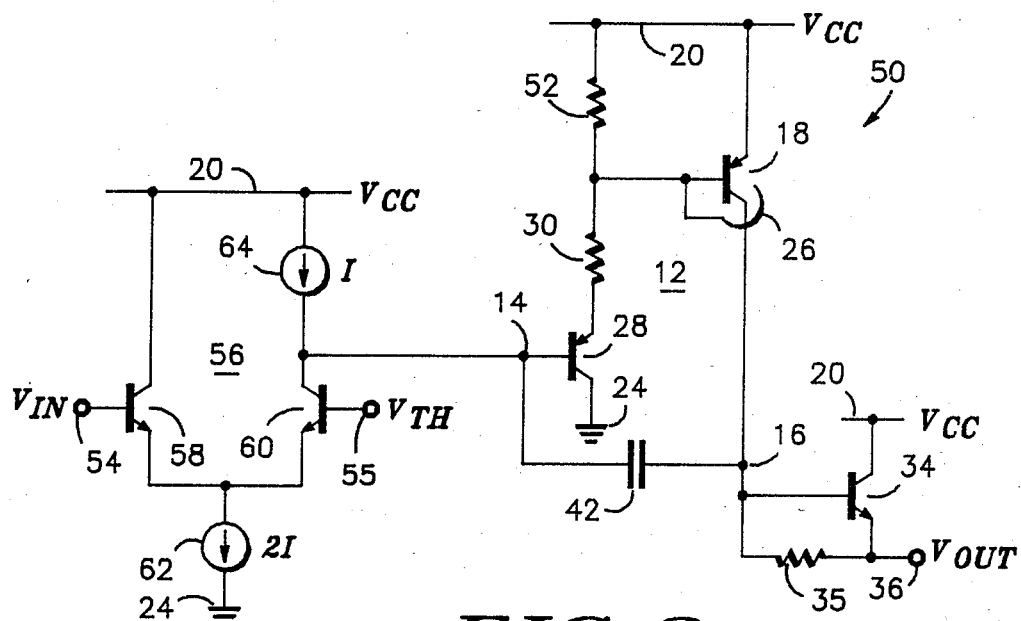
FIG. 2 is a schematic diagram illustrating a second embodiment of the invention.

Turning now to FIG. 2 there is shown driver circuit 50 of a second embodiment of the present invention. Components of FIG. 2 of like components of FIG. 1 are referenced by the same reference numerals. Current source 32 of FIG. 1 is shown replaced by resistor 52 which supplies current to node 22. Driver circuit 50 operates in a similar manner as driver 10 in that equal currents are either sourced or sunk at input 14 to cause an inverted output signal at output 16 to be produced having controlled slew rates with respect to logic control pulse signals applied to first input 54 of comparator amplifier 56. Comparator amplifier 56 is an NPN differential comparator amplifier having a tail current of value 2I sourced from the differentially connected transistors 58 and 60 by current sink 62. As understood, at balance, both transistors 58 and 60 supply a current of magnitude I to current sink 62. However, as the logic input pulse signal applied to input 54 varies about the value of the threshold voltage $V_{TH}$ supplied at input 55, a current of value I is either sourced to input 14 or is sourced therefrom due to transistor 60 being rendered non-conductive or conducting respectively. Thus, comparator 56 acts as the aforedescribed current switch with reference to FIG. 1.

Although P-ring or auxiliary collector 26 has been shown as being connected to the base of transistor 18, it should be recognized that the above novel driver circuit will work in the manner aforedescribed with P-ring 26 being returned to the emitter of transistor 28 instead of to the base of transistor 18. Moreover, it is understood that the output driver of buffer circuit 34 could have been a PNP device, but a high current PNP transistor would have been prohibitively expensive for the applications in which driver circuit 10 and 50 are visualized. Further, the output driver circuit could have been an NPN Darlington connected transistor. However, the emitter follower transistor 34 as driven by a saturated PNP (transistor 18) allows the output voltage derived at output 36 to swing easily up to nearly the value of VCC.

Thus, what has been described above are novel driver circuits which buffer the logic input pulse signal supplied thereto from load means connected to the driver circuits. In one application the load may be a serial data bus and the logic circuit a CMOS integrated circuit wherein the logic input pulse signals are supplied in serial fashion to the serial data bus. The driver circuits generate output logic signals having controlled slew rates such that the high frequency components contained in the logic input pulse signals leading and trailing pulse edges are inhibited or at least severely limited. The output of the driver circuits have the added advantages of presenting high output impedances at the outputs when the integrator portion of each driver circuit is low and a low output impedance as the output goes high. This allows wiring together outputs for the serial data bus structure.

We claim:

1. Monolithic driver circuit having an input for driving a load at an output thereof, comprising:
    inverting amplifier means having an input and an output, said inverting amplifier means providing output signals inverted in phase with respect to input signals applied to said input;
    current switch means coupled to said input of said inverting amplifier means and being adapted to receive applied logic control signals at said input of the driver circuit for sourcing or sinking currents of substantially equal magnitudes at said input of said inverting amplifier means depending on the phase of said applied logic control signals;
    feedback means coupled between said output and input of said inverting amplifier means which in conjunction with said inverting amplifier means produces said output signals having controlled and substantially symmetrical slew rates associated therewith; and
    buffer means coupled between said output of said inverting amplifier means and the output of the driver circuit for buffering said output of said inverting amplifier means from the load.

2. The driver circuit of claim 1 wherein said inverting amplifier means includes:
    a first PNP transistor connected as a common emitter amplifier to said buffer means for producing said inverted output signals at said output of said inverting amplifier means;
    a second PNP transistor connected as a common collector amplifier and receiving said input signals at said input of said inverting amplifier means;
    circuit means coupled between said first and second PNP transistors; and
    current source means for sourcing a current having a predetermined temperature coefficient through said circuit means for biasing said input of said inverting amplifier means at a voltage level the magnitude of which lies midway between the upper and lower magnitudes of said applied logic control signals.

3. The driver circuit of claim 2 wherein:
    said first PNP transistor has an emitter, collector, auxiliary collector and base, said emitter being coupled to a first power supply conductor, said collector being coupled to said output of said inverting amplifier means, said base being coupled at a circuit node to both said current source means and said circuit means, said auxiliary collector at least partially surrounding said collector and being connected to said base; and
    said second PNP transistor has an emitter, collector, and base, said emitter being coupled via said circuit means to said circuit node; said collector being coupled to a second power supply conductor, and said base being coupled to said input of said inverting amplifier means.

4. The driver of claim 3 wherein:
    said feedback means is a capacitor; and
    said circuit means is a first resistor.

5. The driver of claim 4 wherein said current switch means includes a second resistor connected between an input of the driver circuit and said input of said inverting amplifier means.

6. The driver of claim 5 wherein said buffer means includes a NPN transistor having an emitter, collector and base, said emitter being coupled to an output of the driver circuit, said collector being coupled to said first power supply conductor, said base being coupled to said output of said inverting amplifier means.

7. The driver of claim 1 wherein said inverting amplifier means includes:
    a first PNP transistor connected as a common emitter amplifier for providing said inverted output signals at said output of said inverting amplifier means;
    a second PNP transistor connected as a common collector amplifier which receives said input signals at said input of said inverting amplifier means; and
    circuit means coupling said second PNP transistor to said first PNP transistor.

8. The driver circuit of claim 7 wherein said current switch means is a differential comparator amplifier having first and second inputs and an output, said applied logic control signals being supplied to said first input, said second input receiving a threshold reference voltage and said output being coupled to said input of said inverting amplifier means.

9. The driver circuit of claim 8 wherein said first PNP transistor includes auxiliary collector means coupled to said circuit means for inhibiting said first PNP transistor from being driven into hard saturation.

10. The driver circuit of claim 9 wherein said buffer means includes a NPN transistor coupled between said output of said inverting amplifier means and an output of the driver circuit in a voltage follower configuration.

11. The driver circuit of claim 10 wherein said feedback means is a capacitor.

* * * * *